United States Patent
Chen et al.

(10) Patent No.: US 12,336,366 B2
(45) Date of Patent: Jun. 17, 2025

(54) ELECTRODE STRUCTURE AND QUANTUM DOT ELECTROLUMINESCENT DEVICE

(71) Applicant: NATIONAL TSING HUA UNIVERSITY, Hsinchu (TW)

(72) Inventors: Hsueh-Shih Chen, Hsinchu (TW); Shuan Yang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 504 days.

(21) Appl. No.: 17/950,170

(22) Filed: Sep. 22, 2022

(65) Prior Publication Data
US 2023/0380201 A1    Nov. 23, 2023

(30) Foreign Application Priority Data
May 18, 2022   (TW) .................................. 111118543

(51) Int. Cl.
| H10K 50/115 | (2023.01) |
| H10K 50/15 | (2023.01) |
| H10K 50/16 | (2023.01) |
| H10K 102/00 | (2023.01) |

(52) U.S. Cl.
CPC ........... *H10K 50/115* (2023.02); *H10K 50/15* (2023.02); *H10K 50/16* (2023.02); *H10K 2102/00* (2023.02)

(58) Field of Classification Search
None
See application file for complete search history.

(56) References Cited

U.S. PATENT DOCUMENTS 10,901,543 B1 *   1/2021   Bayat .................... G06F 3/0446

* cited by examiner

*Primary Examiner* — Anthony Ho
(74) *Attorney, Agent, or Firm* — CKC & Partners Co., LLC

(57) ABSTRACT

An electrode structure is disclosed. The electrode structure consists of a seed layer, an electrode layer formed on the seed layer and a cover layer formed on the electrode layer. This electrode structure is for application in the manufacture of a quantum dots electroluminescent device, so as to act as an anode electrode or a cathode electrode of the QD electroluminescent device. Experimental data have revealed that, there is no transmittance imbalance occurring in the QD electroluminescent device using the particularly-designed electrode structure. Moreover, the QD electroluminescent device has enhanced in the brightness, total current efficiency and EQE thereof.

18 Claims, 12 Drawing Sheets

ELECTRODE STRUCTURE AND QUANTUM DOT ELECTROLUMINESCENT DEVICE

BACKGROUND OF THE INVENTION

1. Field of the Invention

The present invention relates to the technology field of quantum dot (QD) electroluminescent devices, and more particularly to an electrode structure for use in a QD electroluminescent device.

2. Description of the Prior Art

In recent years, quantum dot (QD) electroluminescent element has been regarded as having the greatest potential for becoming the next-generation solid state lighting device because of possessing remarkable optoelectrical properties like high-chroma colors and electroluminescent wavelength tunability.

FIG. 1 shows a cross-sectional view of a conventional QD electroluminescent device. Conventionally, a QD electroluminescent device 1a, also called QD light emitting diode (QD-LED), comprises an anode layer 1Aa, a hole injection (HI) layer 1HIa, an emission layer 1EMa containing quantum dots (QDs), an electron transport (ET) layer 1ETa, and a cathode layer 1Ca. According to the disclosures of Taiwan patent publication No. 202139482A1, it is known that the emission layer 1EMa contains a plurality yellow QDs 1YQa and a plurality blue QDs 1BQa, wherein a mixture ratio of the yellow QDs 1YQa to the blue QDs 1BQa is in a range between 1:4 and 1:8. Therefore, after applying a driving voltage to the QD electroluminescent device 1a, the emission layer 1EMa generates a white light that radiates out through the anode layer (e.g. ITO layer) 1Aa.

In general, the cathode layer 1Ca is made of Al, Ag or LiF/Al. It is worth further explaining that, silver is a typical material for use in the manufacture of the cathode layer 1Ca because of possessing outstanding optoelectrical properties such as high conductivity and low optical loss in visible light region. In addition, an Ag cathode film can be easily formed on the ET layer 1ETa by using thermal deposition equipment. However, during the thermal deposition process, growth mechanism of a two-dimensional Ag thin film commonly follows the Volmer-Weber model, in which nucleation is firstly formed on the surface of the substrate (i.e., ET layer 1ETa), followed by crystal growth to larger islands and grains, so as to consequently form a Ag thin film. However, experimental results indicate that, a pure Ag thin-film formed in following the Volmer-Weber model likely leads to having discontinuous morphology due to an adhesion force from the substrate (i.e., ET layer 1ETa). Moreover, the discontinuous morphology is found to seriously affect the surface roughness (Rq) and the transmittance of the Ag-made cathode layer 1Ca. As a result, transmittance imbalance occurs in the QD electroluminescent device 1a due to a significant transmittance difference between the ITO-made anode layer 1Aa and the Ag-made cathode layer 1Ca, thereby affecting the light outcoupling direction of the emission layer 1EMa.

According to above descriptions, it is understood that there is still room for improvement in the Ag-made cathode layer of the conventional QD electroluminescent device. In view of this fact, inventors of the present application have made great efforts to make inventive research and eventually provided an electrode structure for use in a QD electroluminescent device.

SUMMARY OF THE INVENTION

The primary objective of the present invention is to disclose an electrode structure. The electrode structure is for application in the manufacture of a quantum dot (QD) electroluminescent device, so as to act as an anode electrode or a cathode electrode of the QD electroluminescent device. Experimental data have revealed that, there is no transmittance imbalance occurring in the QD electroluminescent device using the particularly-designed electrode structure. Moreover, the QD electroluminescent device is enhanced in the brightness, total current efficiency and EQE thereof.

For achieving the primary objective mentioned above, the present invention provides an embodiment of the electrode structure, which is for being integrated in an electronic component, and comprises:
- a seed layer, connected to a functional material layer in the electronic component;
- an electrode layer, formed on the seed layer, and comprising a main film made of Ag and a dopant enclosed in the main film; and
- a capping layer, formed on the electrode layer;
- wherein the dopant is Cu, and an amount of the dopant is in a range between 0.1% and 20%.

In one practicable embodiment, the electronic component is a regular-type quantum dot (QD) electroluminescent device, such that the functional material layer being an electron transport (ET) layer.

In another one practicable embodiment, the electronic component is an inverted-type quantum dot (QD) electroluminescent device, such that the functional material layer being an hole transport (HT) layer.

In one embodiment, the seed layer is made of a metal oxide.

In one embodiment, the capping layer is also made of a metal oxide, such that the capping layer, the electrode layer and the seed layer constitute a dielectric/metal/dielectric (DMD) structure.

In one embodiment, the seed layer has a first thickness in a range between 2 nm and 5 nm, the electrode layer has a second thickness in a range between 15 nm and 25 nm, and the capping layer has a third thickness in a range between 30 nm and 50 nm.

Moreover, the present invention also provides a quantum dot (QD) electroluminescent device, comprising:
- an anode layer;
- a hole injection layer formed on the anode layer;
- a hole transport layer formed on the hole injection layer;
- an emission layer formed on the hole transport layer;
- an electron transport layer formed on the emission layer; and
- an electrode structure, comprising: a seed layer formed on the electron transport layer, an electrode layer formed on the seed layer, and a capping layer formed on the electrode layer;
- wherein the electrode layer consists of a main film made of Ag and a dopant enclosed in the main film, the dopant is Cu, and an amount of the dopant is in a range between 0.1% and 20%.

In one embodiment, the seed layer is made of a metal oxide.

In one embodiment, the capping layer is also made of a metal oxide, such that the capping layer, the electrode layer and the seed layer constitute a dielectric/metal/dielectric (DMD) structure.

In one embodiment, the seed layer has a first thickness in a range between 2 nm and 5 nm, the electrode layer has a second thickness in a range between 15 nm and 25 nm, and the capping layer has a third thickness in a range between 30 nm and 50 nm.

In one practicable embodiment, in case of a voltage source being coupled between the anode and the electrode structure, the emission layer radiates a monochromatic light.

In another one practicable embodiment, in case of a voltage source being coupled between the anode and the electrode structure, the emission layer radiates a multi-wavelength light.

Furthermore, the present invention also provides another one QD electroluminescent device, comprising:
  a cathode layer;
  an electron injection layer formed on the cathode layer;
  an electron transport layer formed on the electron injection layer;
  an emission layer formed on the electron transport layer;
  a hole transport layer formed on the emission layer; and
  an electrode structure, comprising: a seed layer formed on the hole transport layer, an electrode layer formed on the seed layer, and a capping layer formed on the electrode layer;
  wherein the electrode layer consists of a main film made of Ag and a dopant enclosed in the main film, the dopant is Cu, and an amount of the dopant is in a range between 0.1% and 20%.

In one embodiment, the seed layer is made of molybdenum oxide.

In one embodiment, the capping layer is also made of molybdenum oxide, such that the capping layer, the electrode layer and the seed layer constitute a dielectric/metal/dielectric (DMD) structure.

In one embodiment, the seed layer has a first thickness in a range between 2 nm and 5 nm, the electrode layer has a second thickness in a range between 15 nm and 25 nm, and the capping layer has a third thickness in a range between 30 nm and 50 nm.

In one practicable embodiment, in case of a voltage source being coupled between the anode and the electrode structure, the emission layer radiates a monochromatic light.

In another one practicable embodiment, in case of a voltage source being coupled between the anode and the electrode structure, the emission layer radiates a multi-wavelength light.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe an electrode structure for use in a QD electroluminescent device according to the present invention, embodiments of the present invention will be described in detail with reference to the attached drawings hereinafter.

Regular-Type Quantum Dot (QD) Electroluminescent Device

Figure 1:
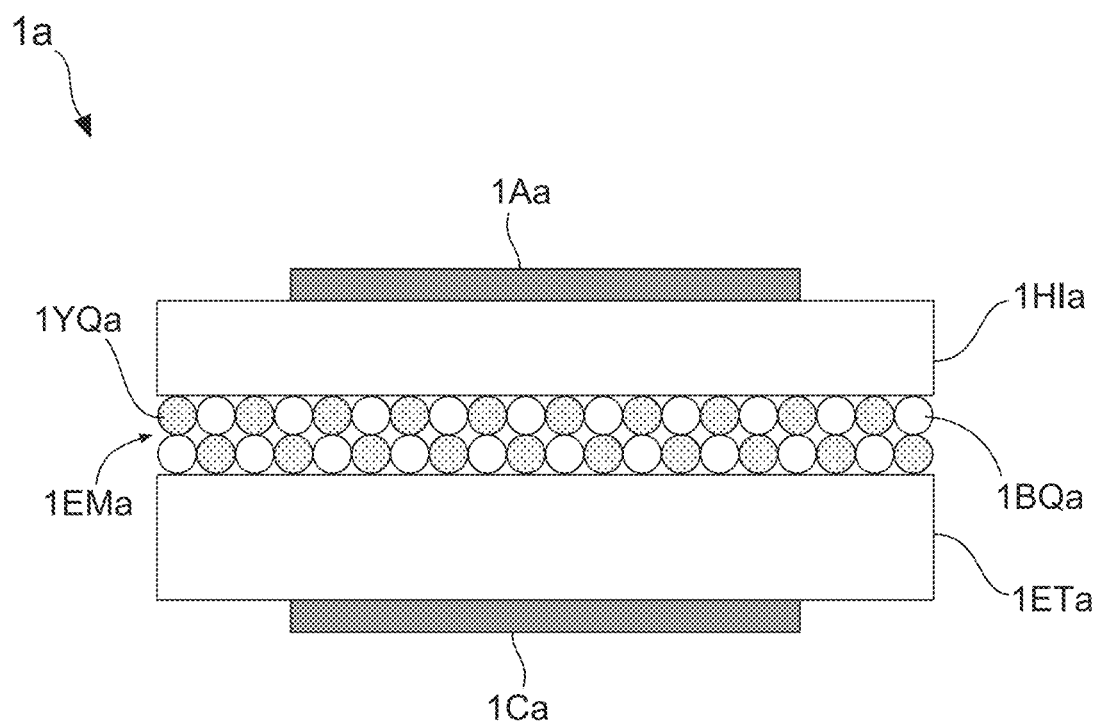
FIG. 1 shows a cross-sectional view of a conventional QD electroluminescent device.
Figure 2:
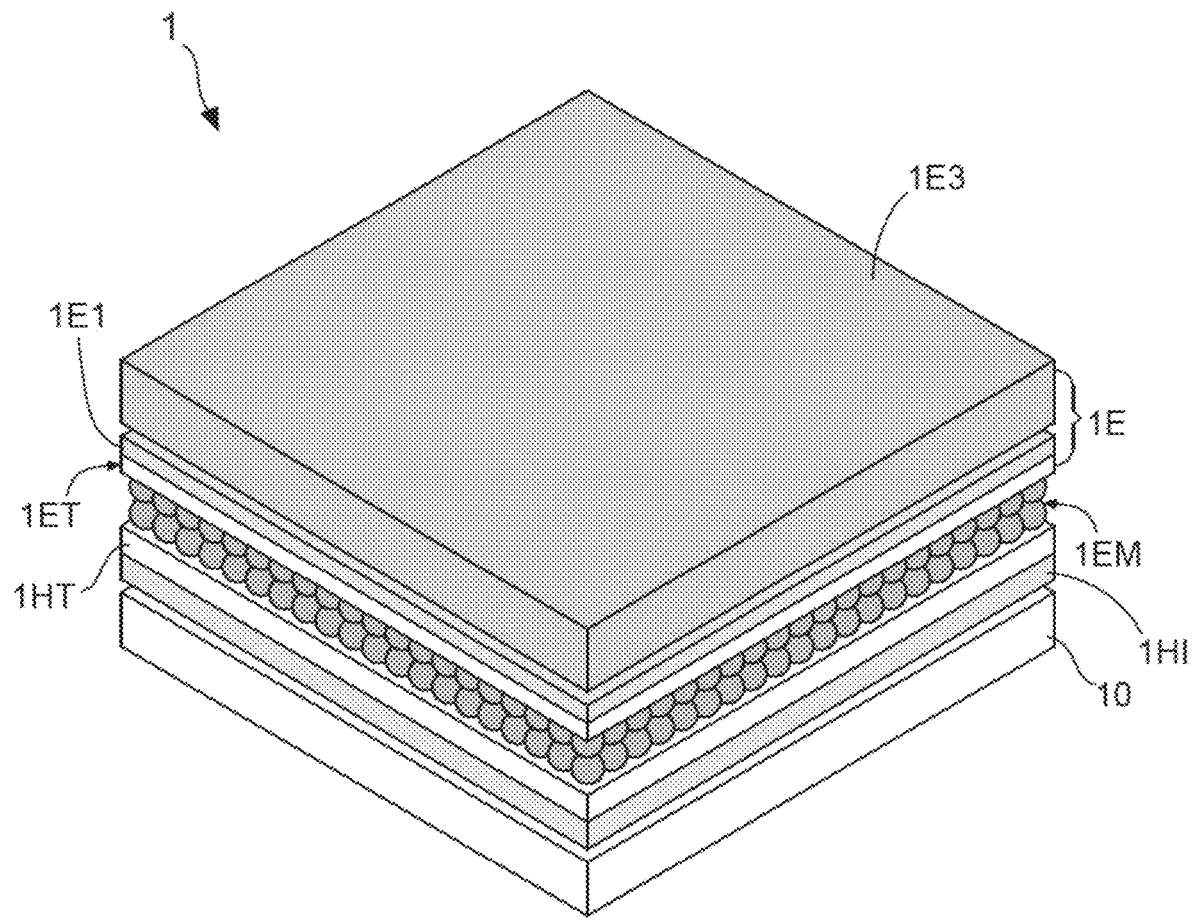
FIG. 2 shows a stereo diagram of a first electronic device including an electrode structure according to the present invention.
Figure 3:
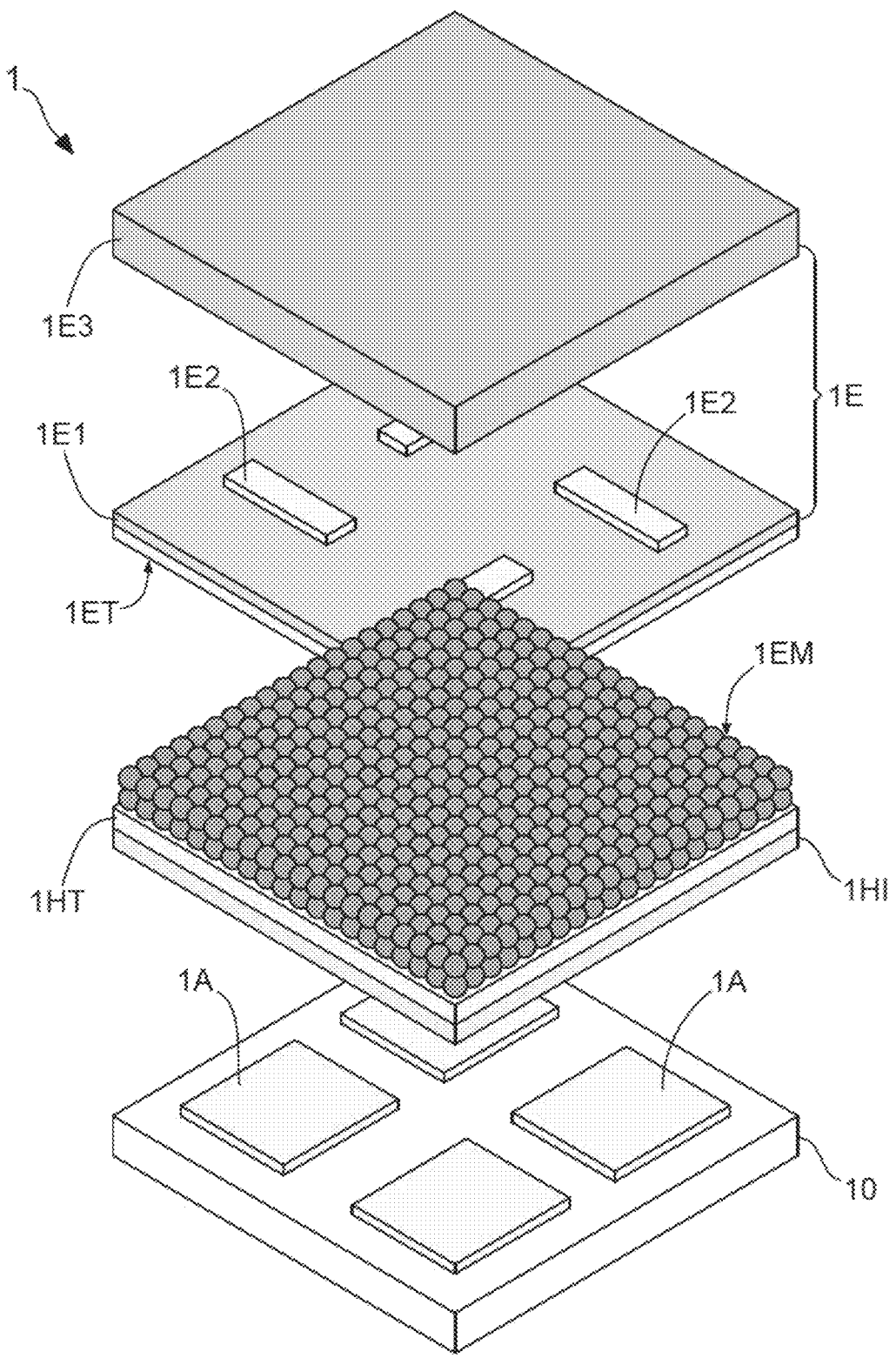
FIG. 3 shows an explode view of the first electronic device.

With reference to FIG. 2, there is shown a stereo diagram of a first electronic device including an electrode structure according to the present invention. Moreover, FIG. 3 shows an explode view of the first electronic device. As FIG. 2 and FIG. 3 show, the present invention discloses an electrode structure 1E for being integrated in a first electronic component 1 like a regular-type QD electroluminescent device (or called QD-LED), of which the first electronic component 1 comprises: an anode layer 1A, a hole injection layer 1HI formed on the anode layer 1A, a hole transport layer 1HT formed on the hole injection layer 1HI, an emission layer 1EM formed on the hole transport layer 1HT, an electron transport (ET) layer 1ET formed on the emission layer 1EM, and the electrode structure 1E of the present invention.

As FIG. 2 and FIG. 3 show, the electrode structure 1E consists of a seed layer 1E1 formed on the ET layer 1ET, an electrode layer 1E2 formed on the seed layer 1E1, and a capping layer 1E3 formed on the electrode layer 1E2. As described in more detail below, the ET layer 1ET is made of a plurality of ZnMgO particles, and the electrode layer 1E2 includes a main film made of Ag and a dopant enclosed in the main film. In one embodiment, the dopant is Cu, and an amount of the dopant is in a range between 0.1% and 20%. Particularly, the seed layer 1E1 is made of a metal oxide, such that the Cu-doped Ag film (i.e., the electrode layer 1E2) deposited on the seed layer 1E1 by co-evaporation has a continuous morphology and a low surface roughness (Rq). On the other hand, the capping layer 1E3 is also made of a metal oxide, thereby making the capping layer, the electrode layer and the seed layer constitute a dielectric/metal/dielectric (DMD) structure. According to experimental data, the electrode structure 1E has a highest transmittance up to 88%.

Inverted-Type QD Electroluminescent Device

Figure 4:
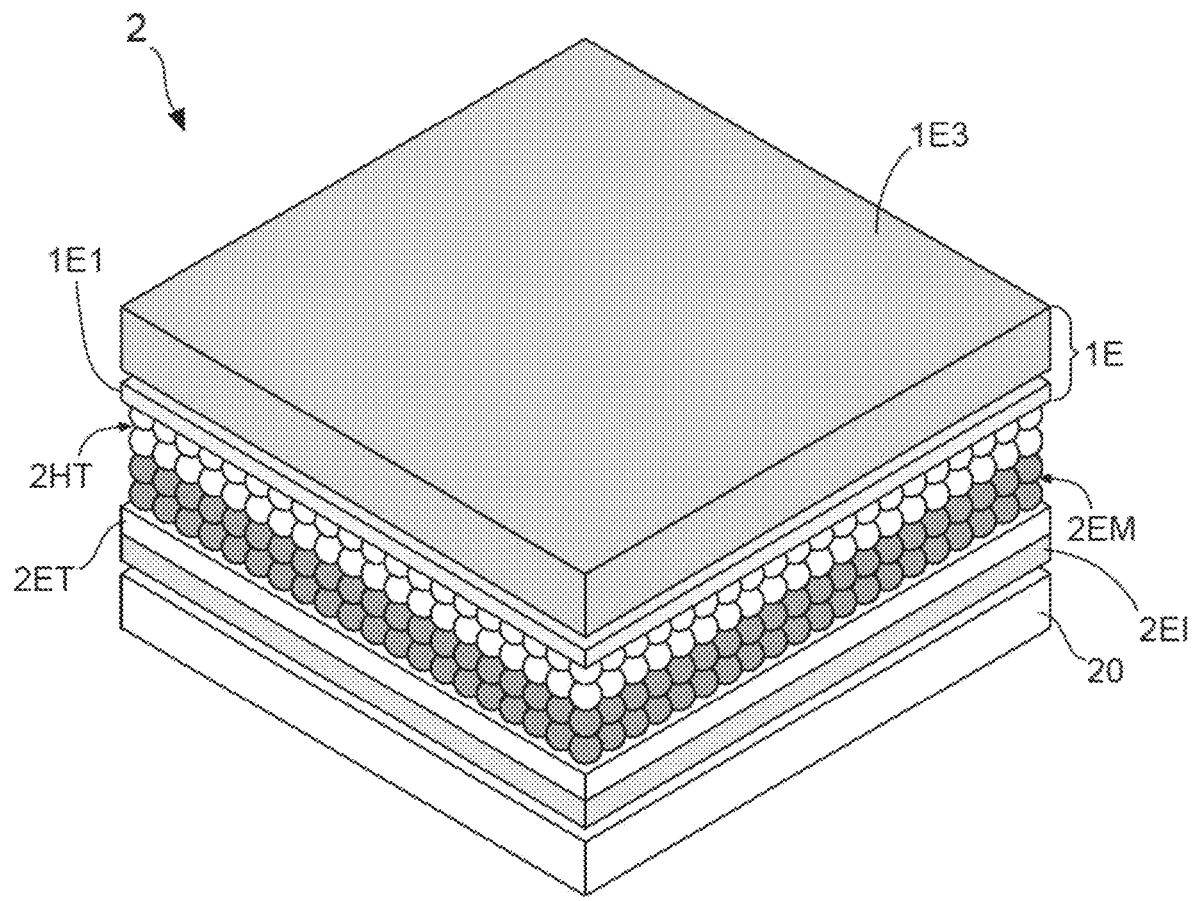
FIG. 4 shows a stereo diagram of a second electronic device including the electrode structure according to the present invention.
Figure 5:
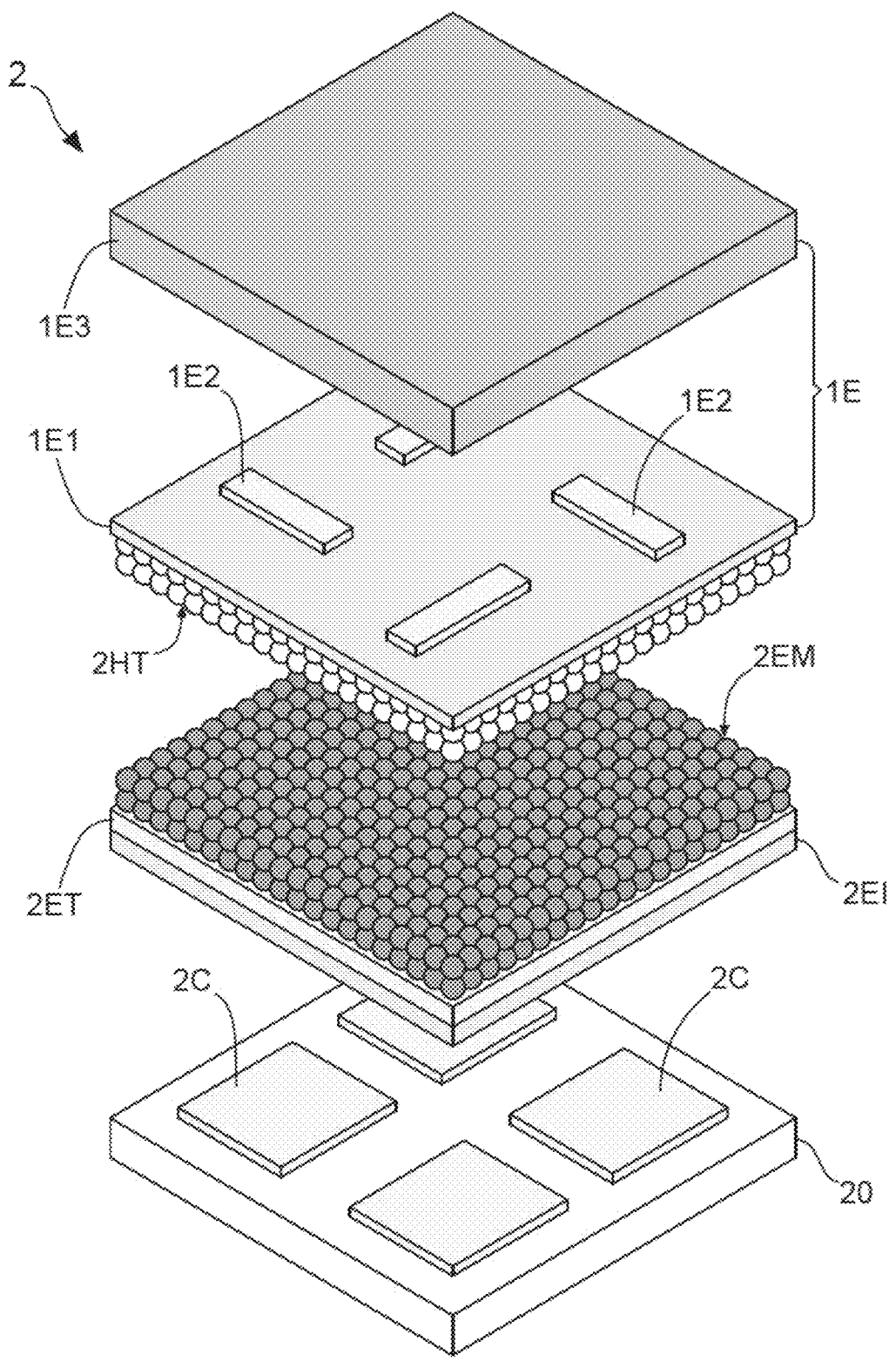
FIG. 5 shows an explode view of the second electronic device.

With reference to FIG. 4, there is shown a stereo diagram of a second electronic device including the electrode structure according to the present invention. Moreover, FIG. 5 shows an explode view of the second electronic device. As FIG. 4 and FIG. 3 show, the electrode structure 1E of the present invention can also be integrated in a second electronic component 2 like an inverted-type QD electroluminescent device, of which the second electronic component 2 comprises: a cathode layer 2C, an electron injection layer 2EI formed on the cathode layer 2C, an electron transport layer 2ET formed on the electron injection layer 2EI, an emission layer 2EM formed on the electron transport layer 2ET, a hole transport layer 2HT formed on the emission layer 2EM, and the electrode structure 1E of the present invention.

As FIG. 4 and FIG. 5 show, the electrode structure 1E consists of a seed layer 1E1 formed on the hole transport layer 2HT. Moreover, in the electrode structure 1E, the seed layer 1E1 has a first thickness in a range between 2 nm and 5 nm, the electrode layer 1E2 has a second thickness in a range between 15 nm and 25 nm, and the capping layer 1E3 has a third thickness in a range between 30 nm and 50 nm.

Experimental Data

Figure 6:
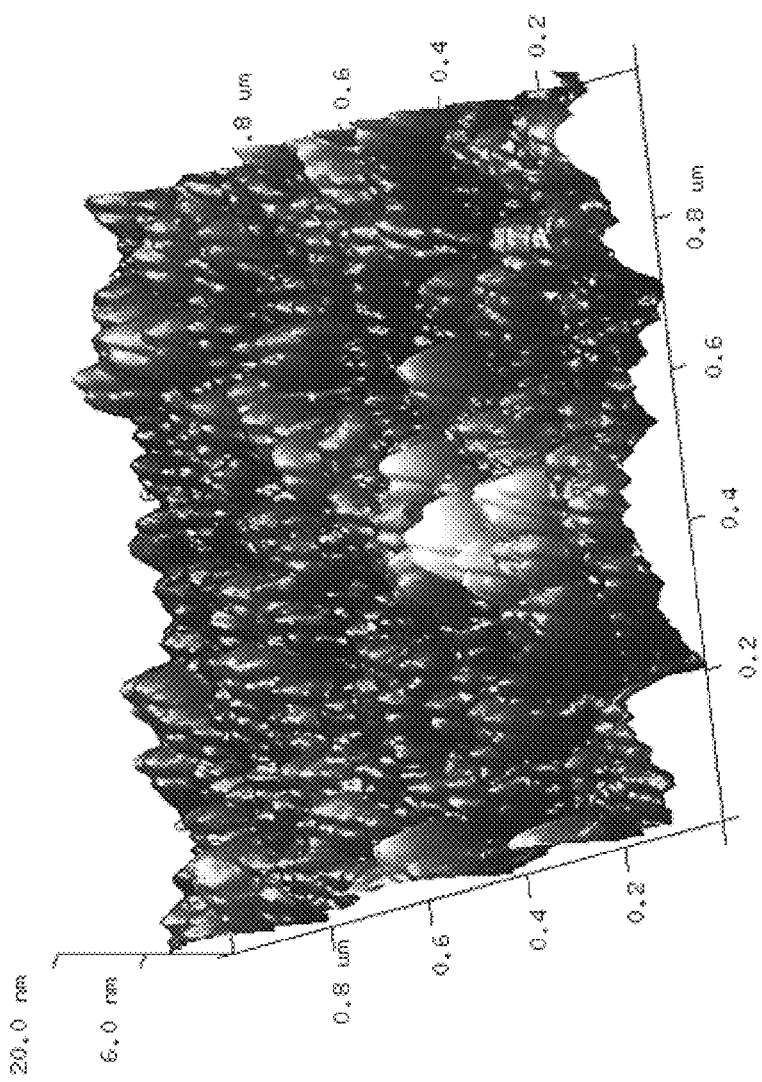
FIG. 6 shows an AFM image of a first experimental device generated by an atomic force microscope imaging system.
Figure 7:
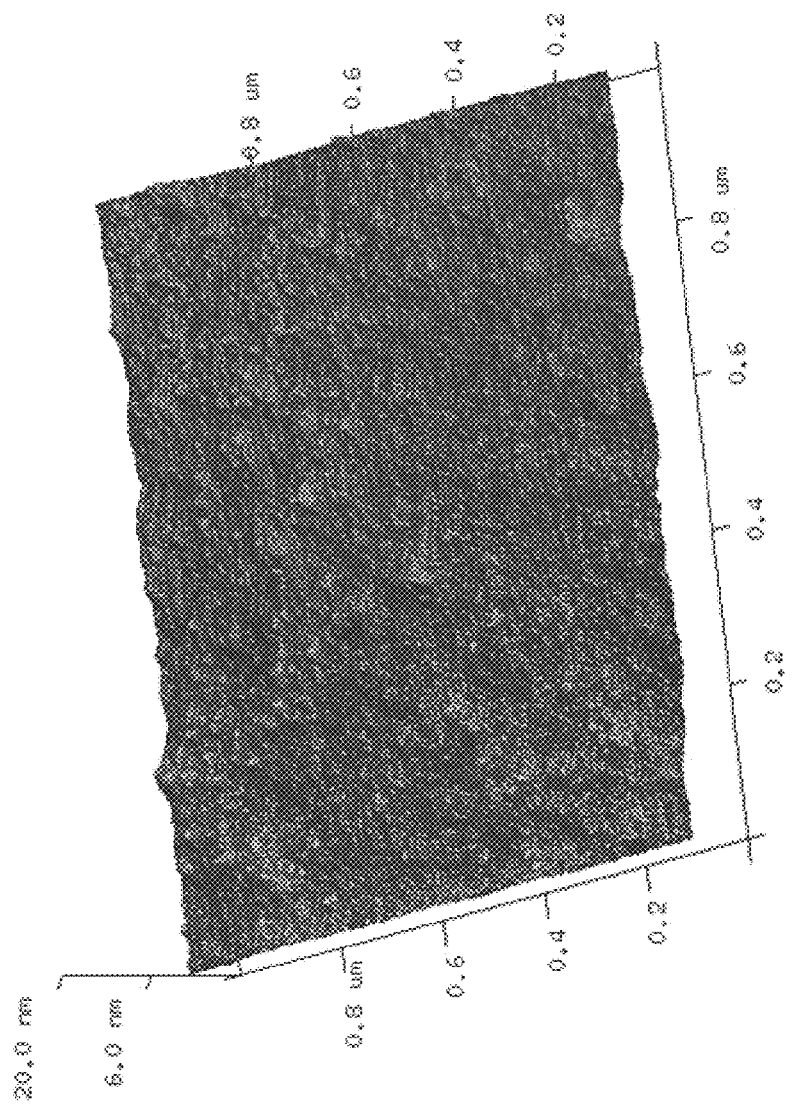
FIG. 7 shows an AFM image of a second experimental device generated by the atomic force microscope imaging system.

Conventionally, a pure Ag thin-film formed in following the Volmer-Weber model likely leads to having discontinuous morphology due to an adhesion force from the substrate (i.e., ET layer or HT layer). Moreover, the discontinuous morphology is found to seriously affect the surface roughness (Rq) and the transmittance of the Ag thin-film. Accordingly, a first experimental device and a second experimental device are designed and manufactured, of which the first experimental device consists a substrate and an Ag film formed on the substrate. On the other hand, the second experimental device includes a substrate, a seed film and a Ag film, in which the seed film is made of ZnMgO so as to be formed on the substrate, and the Ag film is formed on the ZnMgO film. FIG. 6 shows an AFM image of a first experimental device generated by an atomic force microscope imaging system, and FIG. 7 shows an AFM image of a second experimental device generated by the atomic force microscope imaging system. According to FIG. 6 and FIG. 7, the Ag film of the first experimental device has a surface roughness (Rq) of 4.04 nm, and the Ag film of the second experimental device has a surface roughness (Rq) of 0.66 nm. Therefore, experimental data have proved that, the Ag film (i.e., the electrode layer 1E2) deposited on the ZnMgO film (i.e., seed layer 1E1) by co-evaporation has a continuous morphology and a low surface roughness (Rq).

Figure 8A:
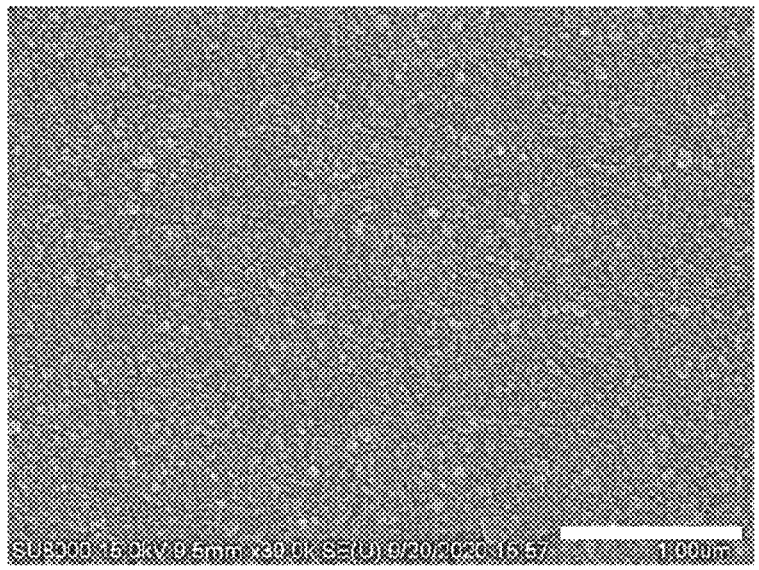
FIG. 8A shows an SEM image of a 10 nm thick Ag film generated by a scanning electron microscope imaging system.
Figure 8B:
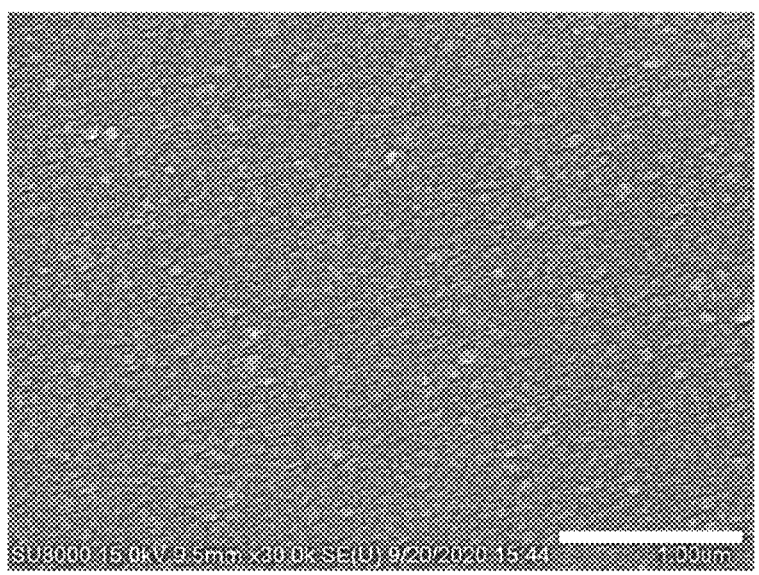
FIG. 8B shows an SEM image of a 20 nm thick Ag film generated by the scanning electron microscope imaging system.
Figure 8C:
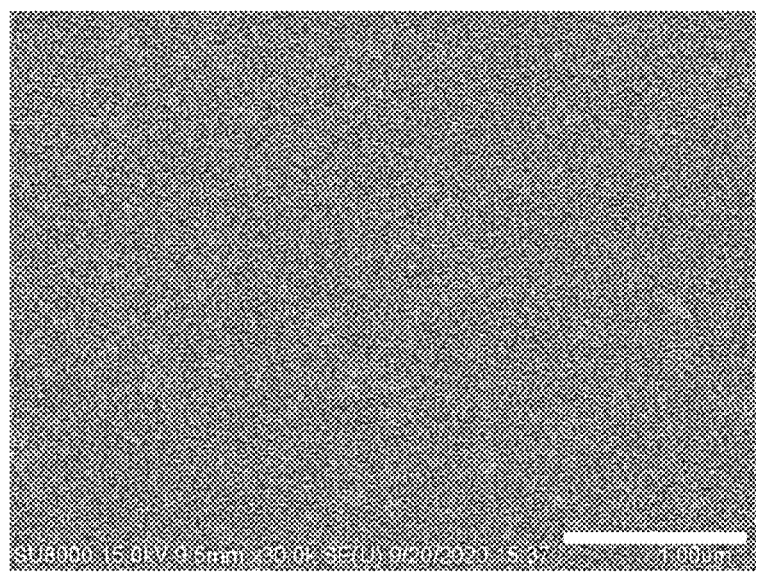
FIG. 8C shows an SEM image of a 30 nm thick Ag film generated by the scanning electron microscope imaging system.

In addition, FIG. 8A shows an SEM image of a 10 nm thick Ag film generated by a scanning electron microscope imaging system, FIG. 8B shows an SEM image of a 20 nm thick Ag film, and FIG. 8C shows an SEM image of a 30 nm thick Ag film. According to FIG. 8A, it is able to find that 10 nm thick Ag film has a high surface roughness and an unfavorable morphology, seriously affecting the conductivity and the transmittance of the 10 nm thick Ag film. On the other hand, according to FIG. 8B and FIG. 8C, it is observed that the surface roughness of the Ag thin film declines from 9.37 nm to 1.64 nm with response to the thickness being increased from 10 nm to 30 nm.

Figure 9A:
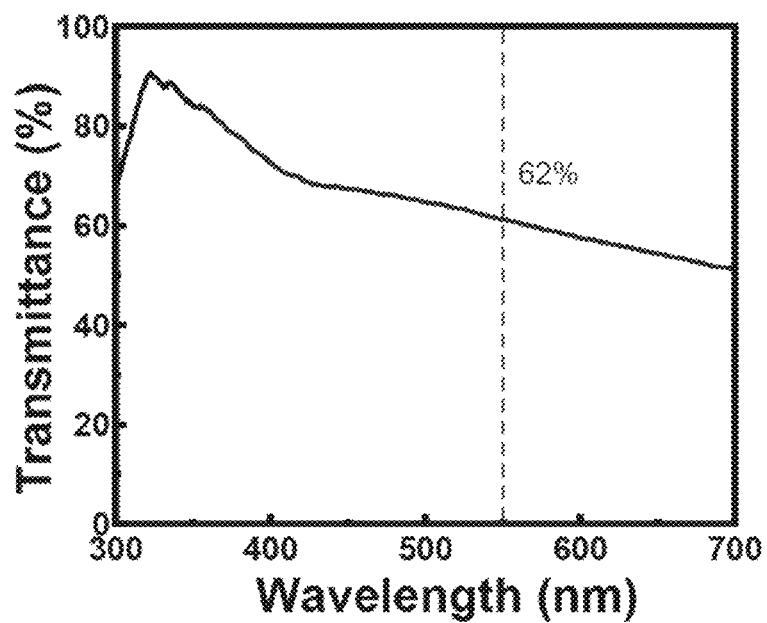
FIG. 9A shows a curve graph of transmittance versus wavelength of the 10 nm thick Ag film.
Figure 9B:
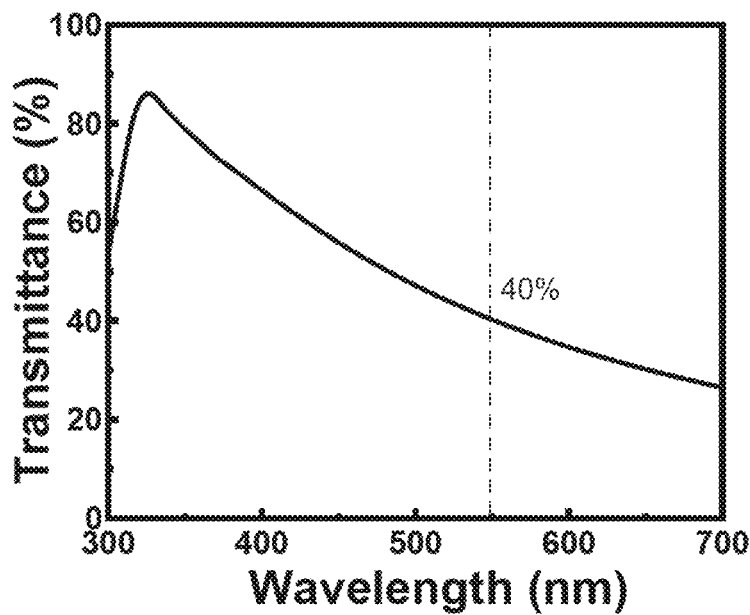
FIG. 9B shows a curve graph of transmittance versus wavelength of the 20 nm thick Ag film.
Figure 9C:
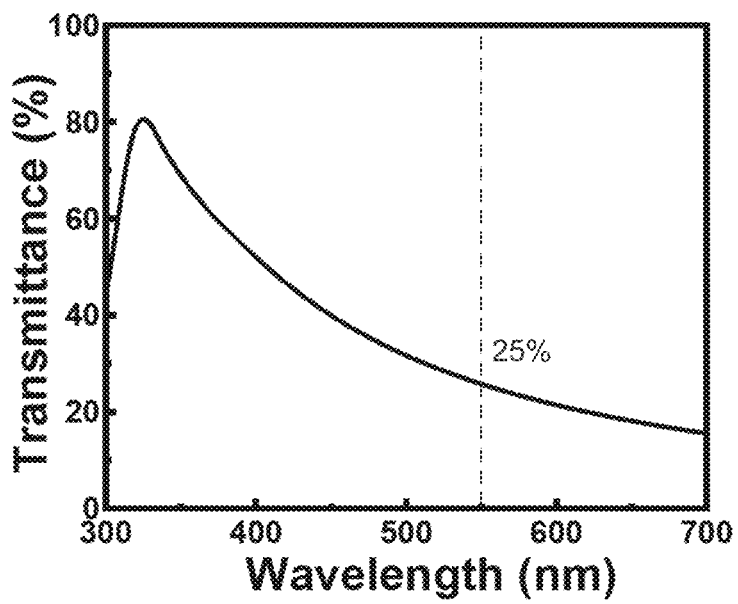
FIG. 9C shows a curve graph of transmittance versus wavelength of the 30 nm thick Ag film.

Moreover, FIG. 9A shows a curve graph of transmittance versus wavelength of the 10 nm thick Ag film, FIG. 9B shows a curve graph of transmittance versus wavelength of the 20 nm thick Ag film, and FIG. 9C shows a curve graph of transmittance versus wavelength of the 30 nm thick Ag film. From the FIG. 9A, FIG. 9B and FIG. 9C, it is known that the transmittance of the 10 nm thick Ag film, the 20 nm thick Ag film and the 30 nm thick Ag film is 62%, 40% and 25%, respectively. In other words, the transmittance of the Ag thin film declines as the thickness is increased.

According to the present invention, the capping layer 1E3, the electrode layer 1E2 and the seed layer 1E1 sequentially formed on a functional material layer of an electronic component (i.e., the ET layer of the regular-type QD electroluminescent device or the HT layer of the inverted-type QD electroluminescent device) constitute a dielectric/metal/dielectric (DMD) structure. It is worth particularly explaining that, the dielectric/metal/dielectric (DMD) structure is found to have some specific properties at least including high transmittance and low sheet resistance. Accordingly, a variety of DMD samples are manufactured, wherein each said DMD sample consists of a seed layer 1E1, an electrode layer 1E2 and a 40 nm thick capping layer 1E3. Information of the multiple DMD samples is provided in following table (1). Therefore, according to table (1), it is known that the DMD sample No. IV exhibits a highest transmittance up to 88%.

TABLE 1

| Sample No. | Transmittance@550 nm (%) | Sheet resistance (Ω/sq) |
|---|---|---|
| I without including seed layer) | 72 | 8.5 |
| II (including 1 nm thick seed layer) | 69 | 3.9 |
| III (including 2 nm thick seed layer) | 70 | 4.0 |
| IV (including 3 nm thick seed layer) | 88 | 5.5 |
| V including 4 nm thick seed layer) | 80 | 5.0 |

Figure 10:
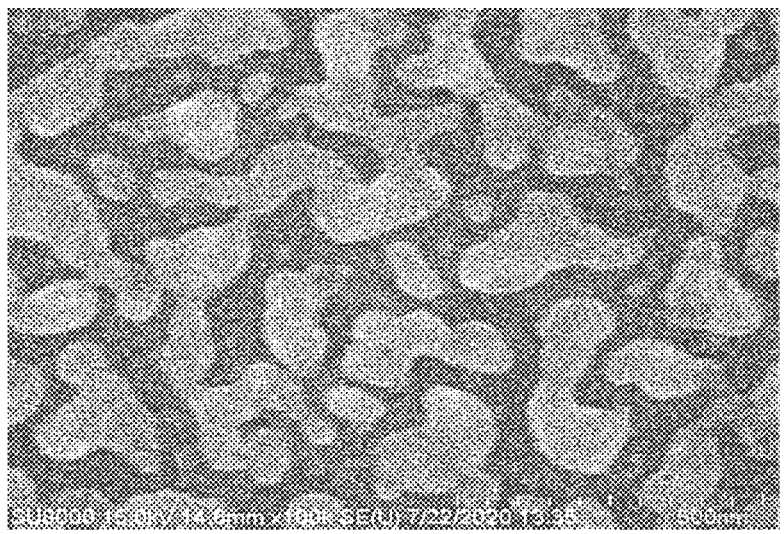
FIG. 10 shows an SEM image of an Ag film.
Figure 11:
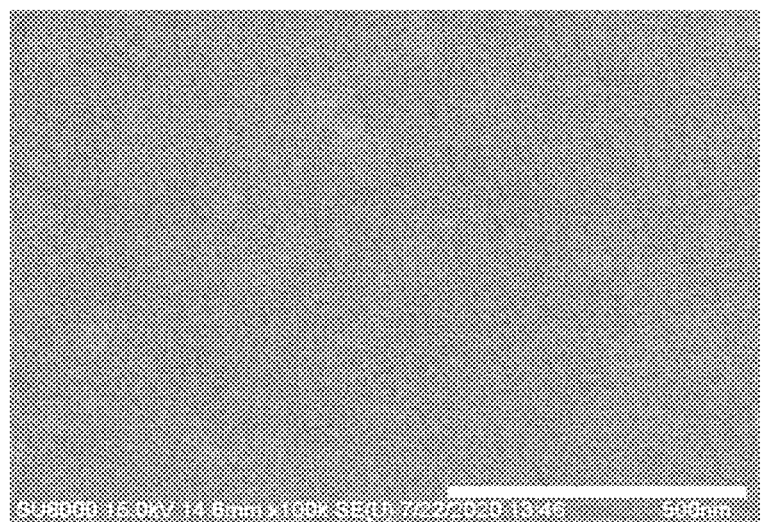
FIG. 11 shows an SEM image of a Cu-doped Ag film.

Since Ag exhibits lowest adhesion strengths with an oxide-made substrate (e.g., the seed layer 1E1) compared with other metals, thermal stability of a pure Ag film is commonly inferior to that of other metal film. In the electrode structure 1E of the present invention, the electrode layer 1E2 formed on the seed layer 1E1 made of metal oxide is particularly designed to consist of an Ag film and a Cu dopant enclosed in the Ag film. For example, the electrode layer 1E2 is a 4% Cu-doped Ag film. It needs to further explain that, after the Cu-doped Ag film (i.e., the electrode layer 1E2) is formed on the seed layer 1E1, a thermal annealing process is subsequently applied to the Cu-doped Ag film under 150° C. for 2 hours. FIG. 10 shows an SEM image of an Ag film, and FIG. 11 shows an SEM image of a Cu-doped Ag film From FIG. 10, it is observed that the pure Ag film has a discontinuous morphology, and this discontinuous morphology is known leading the pure Ag film to exhibit a poor thermal stability. On the contrary, in FIG. 11 the Cu-doped Ag film has a continuous morphology and a low surface roughness, such that the Cu-doped Ag film has a thermal stability superior to that of the pure Ag film.

Please refer to FIG. 2 again. For determining which improvements occurring in the QD electroluminescent device using the electrode structure 1E, a regular-type QD electroluminescent device is made, and information of each of the functional layers of the regular-type QD electroluminescent device is provided in following table (2).

TABLE 2

| Functional layer | Material |
| --- | --- |
| anode layer 1A | indium tin oxide (ITO) |
| hole injection layer 1HI | PEDOT:PSS |
| hole transport layer 1HT | polyvinylcarbazole (PVK) |
| emission layer 1EM | green quantum dots (ZnCdSeS/ZnS) |
| electron transport layer 1ET | nano-scale oxide particles (ZnMgO) |
| seed layer 1E1 | $MoO_3$ |
| electrode layer 1E2 | Cu-doped Ag film ($Ag_{0.9}Cu_{0.1}$) |
| capping layer 1E3 | $MoO_3$ |

Moreover, in order to determine which improvements occurring in the QD electroluminescent device using the electrode structure 1E, three extra regular-type QD electroluminescent device are made, and information of each of the functional layers of each said regular-type QD electroluminescent device is provided in following tables (3A)-(3C).

TABLE 3A

| Functional layer | Material |
| --- | --- |
| anode layer | indium tin oxide (ITO) |
| hole injection layer | PEDOT:PSS |
| hole transport layer | polyvinylcarbazole (PVK) |
| emission layer | green quantum dots (ZnCdSeS/ZnS) |
| electron transport layer | nano-scale oxide particles (ZnMgO) |
| cathode layer | pure Ag film |

TABLE 3B

| Functional layer | Material |
| --- | --- |
| anode layer | indium tin oxide (ITO) |
| hole injection layer | PEDOT:PSS |
| hole transport layer | polyvinylcarbazole (PVK) |
| emission layer | green quantum dots (ZnCdSeS/ZnS) |
| electron transport layer | nano-scale oxide particles (ZnMgO) |
| seed layer | $MoO_3$ |
| cathode layer | pure Ag film |

TABLE 3C

| Functional layer | Material |
| --- | --- |
| anode layer | indium tin oxide (ITO) |
| hole injection layer | PEDOT:PSS |
| hole transport layer | polyvinylcarbazole (PVK) |
| emission layer | green quantum dots (ZnCdSeS/ZnS) |
| electron transport layer | nano-scale oxide particles (ZnMgO) |
| seed layer | $MoO_3$ |
| cathode layer | Cu-doped Ag film |

Figure 12:
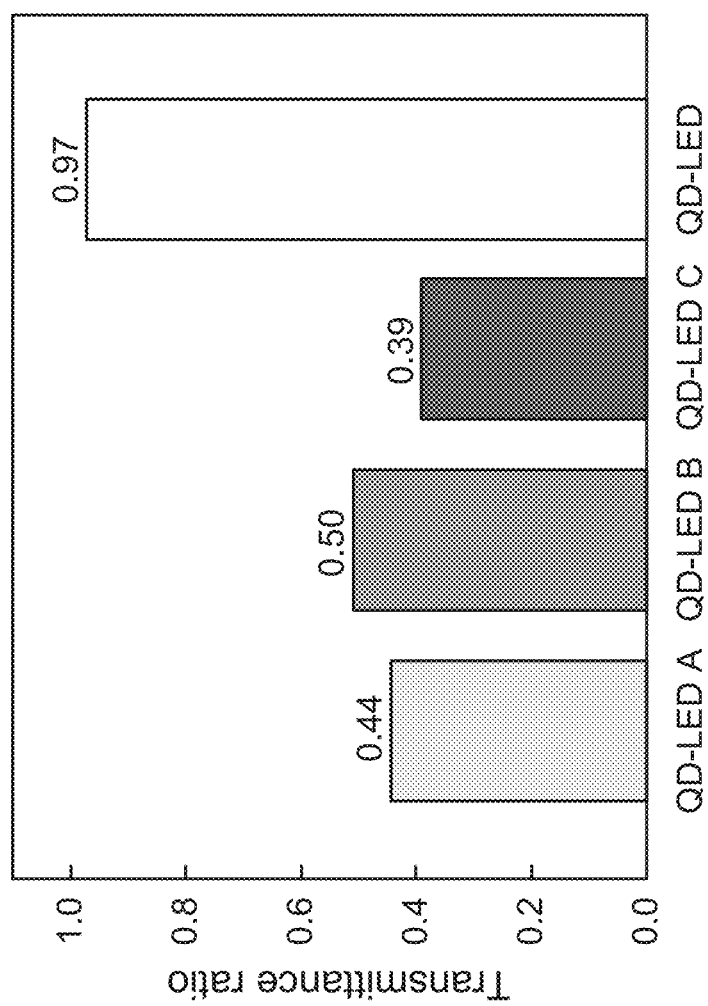
FIG. 12 shows a bar graph of transmittance ratio versus four QD-LEDs.

FIG. 12 shows a bar graph of transmittance ratio versus four QD-LEDs. In FIG. 12, QD-LED A is a regular-type QD electroluminescent device consisting of multiple functional material layers they are listed in above table (3A). On the other hand, QD-LED B is a regular-type QD electroluminescent device consisting of multiple functional material layers they are listed in above table (3B). Moreover, QD-LED C is a regular-type QD electroluminescent device consisting of multiple functional material layers they are listed in above table (3C). It needs to further explain that, in FIG. 12, QD-LED is a regular-type QD electroluminescent device consisting of multiple functional material layers they are listed in above table (2). Thus, according to the experimental data of FIG. 12, an induced transmittance imbalance due to a significant transmittance difference between the ITO-made anode layer and the electrode structure 1E of the present invention is prevented from occurring in the QD electroluminescent device.

Furthermore, according to the experimental data, the QD-LED consisting of multiple functional material layers they are listed in above table (2) has a highest brightness up to 225,500 $cd/m^2$, a maximum current efficiency of 9.12 cd/A and a best external quantum efficiency (EQE) of 11.13%.

Therefore, through above descriptions, all embodiments and their constituting elements of the electrode structure for being integrated in a QD electroluminescent device proposed by the present invention have been introduced completely and clearly; in summary, the present invention includes the advantages of:

(1) The present invention proposes an electrode structure 1E. The electrode structure 1E is for application in the manufacture of a quantum dot (QD) electroluminescent device, so as to act as an anode electrode or a cathode electrode of the QD electroluminescent device. Experimental data have revealed that, there is no transmittance imbalance occurring in the QD electroluminescent device using the particularly-designed electrode structure 1e. Moreover, the QD electroluminescent device is enhanced in the brightness, total current efficiency and EQE thereof.

Moreover, the above description is made on embodiments of the present invention. However, the embodiments are not intended to limit the scope of the present invention, and all equivalent implementations or alterations within the spirit of the present invention still fall within the scope of the present invention.

What is claimed is:

1. An electrode structure for being integrated in an electronic component, comprising:
    a seed layer, being connected to a functional material layer in the electronic component;
    an electrode layer, being formed on the seed layer, and comprising a main film made of Ag and a dopant enclosed in the main film; and
    a capping layer, being formed on the electrode layer;
    wherein the dopant is Cu, and an amount of the dopant being in a range between 0.1% and 20%.

2. The electrode structure of claim 1, wherein the electronic component is a regular-type quantum dot (QD) electroluminescent device, such that the functional material layer being an electron transport (ET) layer.

3. The electrode structure of claim 1, wherein the electronic component is an inverted-type quantum dot (QD) electroluminescent device, such that the functional material layer being an hole transport (HT) layer.

4. The electrode structure of claim 1, wherein the seed layer is made of a metal oxide.

5. The electrode structure of claim 4, wherein the capping layer is also made of a metal oxide, such that the capping layer, the electrode layer and the seed layer constitute a dielectric/metal/dielectric (DMD) structure.

6. The electrode structure of claim 1, wherein the seed layer has a first thickness in a range between 2 nm and 5 nm, the electrode layer having a second thickness in a range between 15 nm and 25 nm, and the capping layer having a third thickness in a range between 30 nm and 50 nm.

7. A quantum dot electroluminescent device, comprising:
an anode layer;
a hole injection layer, being formed on the anode layer;
a hole transport layer, being formed on the hole injection layer;
an emission layer, being formed on the hole transport layer;
an electron transport layer, being formed on the emission layer; and
an electrode structure, comprising: a seed layer formed on the electron transport layer, an electrode layer formed on the seed layer, and a capping layer formed on the electrode layer;
wherein the electrode layer consists of a main film made of Ag and a dopant enclosed in the main film, the dopant being Cu, and an amount of the dopant being in a range between 0.1% and 20%.

8. The quantum dot electroluminescent device of claim 7, wherein the seed layer is made of a metal oxide.

9. The quantum dot electroluminescent device of claim 8, wherein the capping layer is also made of a metal oxide, such that the capping layer, the electrode layer and the seed layer constitute a dielectric/metal/dielectric (DMD) structure.

10. The quantum dot electroluminescent device of claim 7, wherein the seed layer has a first thickness in a range between 2 nm and 5 nm, the electrode layer having a second thickness in a range between 15 nm and 25 nm, and the capping layer having a third thickness in a range between 30 nm and 50 nm.

11. The quantum dot electroluminescent device of claim 7, wherein in case of a voltage source being coupled between the anode and the electrode structure, the emission layer radiating a monochromatic light.

12. The quantum dot electroluminescent device of claim 7, wherein in case of a voltage source being coupled between the anode and the electrode structure, the emission layer radiating a multi-wavelength light.

13. A quantum dot electroluminescent device, comprising:
a cathode layer;
an electron injection layer, being formed on the cathode layer;
an electron transport layer, being formed on the electron injection layer;
an emission layer, being formed on the electron transport layer;
a hole transport layer, being formed on the emission layer; and
an electrode structure, comprising: a seed layer formed on the hole transport layer, an electrode layer formed on the seed layer, and a capping layer formed on the electrode layer;
wherein the electrode layer consists of a main film made of Ag and a dopant enclosed in the main film, the dopant being Cu, and an amount of the dopant being in a range between 0.1% and 20%.

14. The quantum dot electroluminescent device of claim 13, wherein the seed layer is made of molybdenum oxide.

15. The quantum dot electroluminescent device of claim 13, wherein the capping layer is also made of molybdenum oxide, such that the capping layer, the electrode layer and the seed layer constitute a dielectric/metal/dielectric (DMD) structure.

16. The quantum dot electroluminescent device of claim 13, wherein the seed layer has a first thickness in a range between 2 nm and 5 nm, the electrode layer having a second thickness in a range between 15 nm and 25 nm, and the capping layer having a third thickness in a range between 30 nm and 50 nm.

17. The quantum dot electroluminescent device of claim 13, wherein in case of a voltage source being coupled between the anode and the electrode structure, the emission layer radiating a monochromatic light.

18. The quantum dot electroluminescent device of claim 13, wherein in case of a voltage source being coupled between the anode and the electrode structure, the emission layer radiating a multi-wavelength light.

* * * * *